United States Patent
Kosaki et al.

(10) Patent No.: US 6,268,619 B1
(45) Date of Patent: *Jul. 31, 2001

(54) SEMICONDUCTOR DEVICE WITH HIGH ASPECT RATIO VIA HOLE INCLUDING SOLDER REPELLING COATING

(75) Inventors: Katsuya Kosaki; Masahiro Tamaki; Takao Ishida, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,090

(22) Filed: Mar. 11, 1998

(30) Foreign Application Priority Data

Apr. 24, 1997 (JP) ...................................... 9-107528

(51) Int. Cl.[7] .......................... H01L 29/80; H01L 31/112
(52) U.S. Cl. ............................................. 257/276; 257/766
(58) Field of Search ................................... 257/276, 275, 257/728, 277, 283, 279, 773, 774, 766

(56) References Cited

U.S. PATENT DOCUMENTS

| | | | |
|---|---|---|---|
| 4,959,705 | * | 9/1990 | Lemnios et al. ...................... 257/276 |
| 5,027,189 | * | 6/1991 | Shannon et al. ...................... 257/783 |
| 5,378,926 | * | 1/1995 | Chi et al. ............................. 257/767 |
| 5,438,212 | * | 8/1995 | Okaniwa .............................. 257/276 |
| 5,483,092 | | 1/1996 | Kosaki . |
| 5,614,743 | * | 3/1997 | Mochizuki ........................... 257/276 |
| 5,844,321 | * | 12/1998 | Baudet ................................. 257/779 |

FOREIGN PATENT DOCUMENTS

| | | | |
|---|---|---|---|
| 2-39569 | * | 2/1990 | (JP) ..................................... 257/276 |
| 2-39569 A | * | 2/1990 | (JP) ..................................... 257/276 |
| 2162735 | | 6/1990 | (JP) . |
| 3102839 | | 4/1991 | (JP) . |
| 6326055 | | 11/1994 | (JP) . |
| 7193214 | | 7/1995 | (JP) . |
| WO 91/15055 | * | 10/1991 | (WO) .................................. 257/276 |

* cited by examiner

Primary Examiner—Olik Chaudhuri
Assistant Examiner—Phat X. Cao
(74) Attorney, Agent, or Firm—Leydig, Voit & Mayer, Ltd

(57) ABSTRACT

In a semiconductor device, an opening having a high aspect ratio extends from a back surface of a GaAs substrate and is formed by anisotropic dry etching. After an Au film is deposited on the entire back surface of the GaAs substrate, including inside of the opening, a Ni alloy is non-electrolytically plated. The Ni film can also be deposited on the inner wall and the bottom of the opening. An IC substrate or FET may have the Ni film only at an area corresponding to the via hole. The back surface of the IC substrate or FET and the front surface of a package substrate are bonded to each other by AuSn solder poorly wetting the Ni film.

5 Claims, 11 Drawing Sheets

FIG.4

$$[H_2PO_2]^- \xrightarrow{Pd(cat.)} [PO_2]^- + 2H(cat.) \quad \cdots Eq.1$$

$$[PO_2]^- + H_2O \longrightarrow H[HPO_3]^- \quad \cdots Eq.2$$

$$Ni^{2+} + 2H(cat.) \longrightarrow Ni^0 + 2H^+ \quad \cdots Eq.3$$
(REDUCTION OF Ni)

$$[H_2PO_2]^- + H(cat.) \longrightarrow H_2O + OH^- + P^0 \quad \cdots Eq.4$$
(REACTION OF P)

$$[H_2PO_2]^- + H_2O \xrightarrow{Pd(cat.)} H[HPO_3]^- + H_2 \quad \cdots Eq.5$$
(GENERATION OF $H_2$ GAS)

$$Ni^0 + 2H^+ \longrightarrow Ni^{2+} + H_2 \quad \cdots Eq.6$$

FIG.5

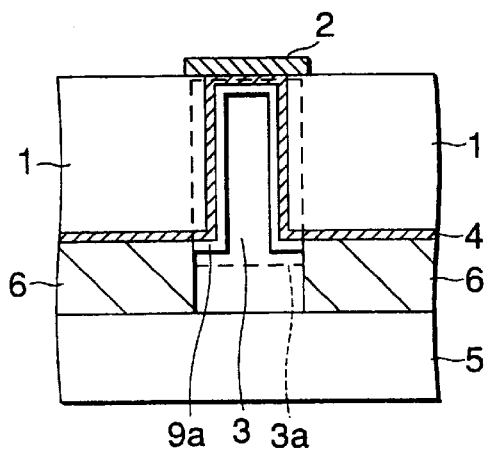

SEMICONDUCTOR DEVICE WITH HIGH ASPECT RATIO VIA HOLE INCLUDING SOLDER REPELLING COATING

BACKGROUND OF THE INVENTION

1. Field of the Invention

The present invention relates to a compound semiconductor device and, more particularly to a structure of a via hole (through-hole) in said semiconductor device and a method and an etchant used for manufacturing the via hold.

2. Discription of the Related Art

Where an IC (integrated Circuit) is to be designed to be used at a frequency higher than quasi-microwave band, since the behavior of electrons as waves cannot be disregarded, the IC must be designed as a distributed constant line. As this distributed constant line, a microstrip circuit line is widely used.

Where a microstrip line is used, as schematically shown in FIG. 17, a via hole 104 must be formed in order to electrically connect an electrode pad 102 on the front surface of a GaAs substrate 101 to a ground conductor, which is metal, on the back surface thereof, and a strip conductor 105 is formed on the front surface of the GaAs substrate 101.

FIG. 18 shows a sectional view when a semiconductor chip (hereinafter referred to as "IC substrate") is die-bonded to a package substrate 106 using AuSn solder 107. As shown in FIG. 18, in order to prevent "solder upheaval or permeance", a barrier metal 108 of e.g. Ni was formed in only a region constituting the via hole 104a on the surface of the conductive Au film 104b.

Further, as shown in FIG. 18, the region occupied by the via hole 104a corresponds to a region whose diameter is twice or more as large as the thickness of the GaAs substrate 101.

The semiconductor device having the same structure as the via hole structure is disclosed in JP-A-2-162735.

Referring now to FIG. 19, an explanation will be given of a method of forming a via hole described in the reference.

First, as shown in FIG. 19(a), an electrode pad 102 is patterned on the front surface of a GaAs substrate 101. As shown in FIG. 19(b), on the back surface of the GaAs substrate 101, an etching mask 109a having an opening pattern is patterned at the area corresponding to the electrode pad 102. Further, as shown in FIG. 19(c), the back surface of the GaAs substrate 101 is subjected to wet etching to form an opening 109. In this case, the diameter of the opening 109 at the back surface of the GaAs substrate 101 is twice or so as large as the thickness of the GaAs substrate 101. As shown in FIG. 19(d), the etching mask 109a is removed.

As shown in FIG. 19(e), a conductive Au film 104b is plated onto the entire back surface of the GaAs substrate 101.

Thereafter, as shown in FIG. 19(f), a resist pattern 110 is formed at an area except the region constituting the via hole 104a on the back surface of the GaAs substrate 101.

The resist pattern 110 has an opening pattern at the area corresponding to the via hole 104a.

As shown in FIG. 19(g), the GaAs substrate 101 is subjected to electrolytic or non-electrolytic Ni plating to form a barrier metal 108 of Ni on the surface of the via hole 104a.

As shown in FIG. 19(h), the resist pattern 110 is etched away to complete an IC substrate.

The back surface of the IC substrate shown in FIG. 19(h) is bonded to the front surface of the package substrate 106 to provide a semiconductor device having a sectional structure as shown in FIG. 18.

However, the semiconductor device thus manufactured has the following defects. In the via hole 104 included in the semiconductor device shown in FIG. 18 (via hole 104a in FIG. 19) is opened by wet etching it reaches the front surface of the GaAs substrate 101 from the back surface thereof.

However, when the via hole is opened by the wet etching as described above, the diameter of the opening 109 formed on the back surface of the GaAs substrate 101 was twice or more as large as the thickness of the GaAs substrate 101. With development of miniaturization of the semiconductor device, reduction of the via hole 104a is a critical problem to facilitate device miniaturization.

In order to solve this problem, one of the inventors of the present invention has already accomplished a semiconductor device in which an opening with a high aspect ratio is made by RIE (Reactive Ion Etching) and an via hole is formed in the opening.

FIG. 20(a) shows a sectional structure of the via hole disclosed in JP-A-7-193214.

In FIG. 20(a), reference numeral 111 denotes an underlying wiring 111 applied to the back surface of the GaAs substrate 101; 112 denotes a film stacked on the front surface of the GaAs substrate 101 which is an insulating film serving as an etching mask when the opening 109 for making a via hole is formed; 113 denotes a sputter layer having a two-layer structure of a layer of any material of Ti, Cr and Ni, and Au, which is stacked on the internal wall of the opening 109; 114 denotes an non-electrolytic Ni plating layer stacked in the opening 109 where the sputter layer 113 is stacked; 115 denotes an Au plating layer stacked on the surface of the non-electrolytic plating layer 114; and 116 denotes a power supply layer consisting of the sputter layer 113, non-electrolytic Ni plating 114 and Au plating layer 115.

In the semiconductor device described above, because the internal wall of the opening does not become flat when the sputter layer 113 serving as a catalyst for film deposition by plating, the non-electrolytic Ni plating layer 114 is further deposited on the internal wall and bottom of the opening 109a constituting the via hole 104a within the GaAs substrate 101 so that their surface becomes flat. Thus, the Au plating layer 115 which is a main part of the power supply layer 116 could be formed to have a uniform thickness along the front surface of the GaAs substrate 1 and the shape of the internal wall of the opening constituting the via hole 104a.

The above reference describes that the via hole 10a shown in FIG. 20(a) is made as follows. The insulating film 112 is patterned as an etching mask pattern on the surface of the GaAs substrate 101. Using it as the etching mask, the opening 109 (not penetrating through the GaAs substrate 101) having a high aspect ratio is formed. After the power supply layer 116 is formed within the opening, the back surface of the substrate 101 is etched back until part of the power supply layer 116 is exposed. Finally, the underlying wiring 111 is formed on the back surface of the GaAs substrate 101.

By forming the via hole 104a within the opening with a high aspect ratio having a structure as shown in FIG. 20(a), it can have an occupying area that is a factor of a few when the opening was made by wet etching.

The present invention has been accomplished in order to solve the above problem, and intends to provide a semiconductor device having a stable structure which has a via hole with a small occupying area, does not generate "solder upheaval" phenomenon and makes no crack, a method of manufacturing it and an etchant suitable for the method.

SUMMARY OF THE INVENTION

A first aspect of a semiconductor device is a device of the prevent invention, which comprises: a semiconductor substrate; an electrode pad formed on the front surface of said semiconductor substrate; an Au film formed on the entire back surface of said semiconductor substrate inclusive of the inner wall and bottom of a cylindrical opening made from the back surface of said semiconductor substrate to the front surface thereof; and a Ni alloy non-electrolytic plating film deposited at a region constituting the via hole including the opening on said Au film.

A second aspect of the semiconductor device is a device of the present invention, which comprises: a semiconductor substrate; an electrode pad formed on the front surface of said semiconductor substrate; a first Au film and a Ni alloy non-electrolytic plating film which are successively stacked on the entire back surface of said semiconductor substrate inclusive of the inner wall and bottom of a cylindrical opening made from the back surface of said semiconductor substrate to the front surface thereof; and a second Au film deposited at an area except a region constituting the via hole including the opening on the said Au film.

A third aspect of the semiconductor device is a device according to the second aspect, wherein said second Au film is a film deposited by plating or evaporation.

A fourth aspect of the semiconductor device is a device of the present invention: a semiconductor substrate; an electrode pad formed on the front surface of said semiconductor substrate; a first Au film on the back surface of said semiconductor substrate inclusive of the inner wall and bottom of a composite stepped opening of a first opening having a large diameter made from the back surface of said semiconductor substrate and a second opening which is a cylinder having a small diameter made from the bottom of said first opening to the front surface of said semiconductor substrate; and an Ni alloy non-electrolytic plating film deposited on said Au film at the area except the said second opening in the region constituting a via hole including said openings.

A fifth aspect of the semiconductor device is a device of the present invention, which comprises: a semiconductor substrate; an electrode pad formed on the front surface of said semiconductor substrate; a first Au film and Ni plating film successively stacked on the back surface of said semiconductor substrate inclusive of the inner wall and bottom of a composite opening of a first opening having a large diameter made from the back surface of said semiconductor substrate and a second opening which is a cylinder having a small diameter made from the bottom of said first opening to the front surface of said semiconductor substrate; and a second Au film deposited on said Ni plating film at the area except the said second opening in the region constituting a via hole including said composite opening, said Ni plating film being a Ni alloy non-electrolytic plating film.

A sixth aspect of the semiconductor device is a device according to the fourth or fifth aspect, wherein said first opening having a large diameter is a cylindrical opening formed by anisotropic dry etching, or an opening which is formed by wet isotropic etching and has a diameter in the back surface of said semiconductor substrate being equal to said large diameter and decreasing with the depth of said semiconductor substrate.

A seventh aspect of the semiconductor device is a device according to any one of the first to fifth aspect, further comprising a package substrate bonded to the surface of said Au film or said second Au film through solder, wherein, of said Au film or said second Au film, said Au film or said second Au film located at the region except a region constituting said via hole is bonded to said package substrate through said solder.

A eighth aspect of the semiconductor device is a device according to any one of the first and the second aspect, wherein the aspect ratio of said opening is within a range from 1 to 10/3.

A ninth aspect of the semiconductor device is a device according to any one of the fourth and fifth aspect, wherein said second opening has a diameter from 25 μm to 60 μm.

A tenth aspect of the method of manufacturing a semiconductor device, which comprises the steps of: forming an electrode pad on the front surface of a semiconductor substrate; forming a cylindrical opening extending from the back surface of said semiconductor substrate to the front surface thereof; by anisotropic dry etching; depositing an Au film on said entire back surface inclusive of the inner wall and bottom of said cylindrical opening by plating; depositing a Ni alloy non-electrolytic plating film on the entire back surface by plating; forming a mask covering a region constituting a via hole including the opening; etching said Ni alloy non-electrolytic plating film using said mask as an etching mask so that said Ni alloy non-electrolytic plating film is selectively left at a region corresponding to said via hole; and removing said mask.

An eleventh aspect of the method of manufacturing a semiconductor device is a method according to the tenth aspectwherein said Ni alloy non-electrolytic plating film is etched using, as an etchant, sulfuric/nitric acid containing sulfuric acid of 96 wt %, nitric acid of 70 wt % and water=1:1:3, or ion milling.

A twelfth aspect of a method of manufacturing a semiconductor device of the present invention, which comprises: forming an electrode pad on the front surface of a semiconductor substrate; forming a cylindrical opening extending from the back surface of said semiconductor substrate to the front surface thereof by anisotropic dry etching; depositing a first Au film on the entire back surface inclusive of the inner wall and bottom of said cylindrical opening by plating; depositing a Ni alloy non-electrolytic plating film on the first Au film on the entire back surface by plating; depositing a second Au film on the entire back surface by plating; forming a mask covering a region constituting a via hole including the opening; etching said Au film using said mask as an etching mask so that said Ni alloy non-electrolytic plating film is selectively left at a region corresponding to said via hole; and removing said mask.

A thirteenth aspect of the method of manufacturing a semiconductor device is a method of the present invention, which comprises the steps of: forming an electrode pad on the front surface of a semiconductor substrate; forming a cylindrical opening extending from the back surface of said semiconductor substrate to the front surface thereof by anisotropic dry etching;

depositing a first Au film on the entire back surface inclusive of the inner wall and bottom of said cylindrical opening by plating; depositing a Ni alloy non-electrolytic plating film on the first Au film on the entire back surface by plating; and depositing a second Au film at the region except said opening on the surface of said Ni alloy non-electrolytic plating film by evaporation so that said Ni alloy non-electrolytic plating film on the surface of said opening constituting a via hole is selectively exposed.

A fourteenth aspect of the method of manufacturing a semiconductor device is a method of the present invention, which comprises the steps of: forming an electrode pad on the front surface of a semiconductor substrate; etching said semiconductor substrate from its back surface to form a first opening having a large diameter; subjecting said semiconductor substrate to anisotropic dry etching from the bottom of said first opening to the front surface of said semiconductor substrate to form a second opening having a small diameter, thereby forming a composite opening of said first and second openings; depositing an Au film on said entire back surface inclusive of the inner wall and bottom of said composite opening by plating; forming a mask on the back surface of said semiconductor substrate except a region constituting a via hole including the composite opening; plating the back surface of said semiconductor substrate with Ni to form a Ni film deposited on the inner wall and bottom of said first opening; and removing said mask.

A fifteenth aspect of the method of manufacturing a semiconductor device is a method of the present invention, which comprises the steps of: forming an electrode pad on the front surface of a semiconductor substrate; etching said semiconductor substrate from its back surface to form a first opening having a large diameter; subjecting said semiconductor substrate to anisotropic dry etching from the bottom of said first opening to the front surface of said semiconductor substrate to form a second opening having a small diameter, thereby forming a composite opening of said first and second openings; depositing a first Au film on said entire back surface inclusive of the inner wall and bottom of said composite opening by plating; plating an Ni film on said first Au film; selectively forming a second Au film on said Ni film at the region expect a region constituting a via hole including said composite opening so that said Ni film at an area corresponding to at least the inner wall and bottom of said first opening in a region corresponding to said via hole is exposed, wherein said Ni film is an Ni alloy non-electrolytic plating film.

A sixteenth aspect of the method of manufacturing a semiconductor device is a method according to any one of the fourteenth and fifteenth aspect, wherein said first opening is made by wet isotropic etching or anisotropic dry etching.

A seventeenth aspect of the method of manufacturing a semiconductor device is a method according to the sixth aspect, wherein said first opening is made by the wet isotropic etching, the first and second openings are formed by etching using the same etching mask, and said etching mask has an opening pattern equal to the diameter of said second opening.

An eighteenth aspect of the method of manufacturing a semiconductor device is a method according to any one of the tenth, twelfth to fifteenth aspects, wherein the Au film exposed to the back surface of said semiconductor substrate or said second Au film are bonded to the surface of a package substrate through AuSn solder which is a soldering material.

A nineteenth aspect of the etchant for an Ni alloy is an etchant of the nineteenth aspect, which is sulfuric/nitric acid containing sulfuric acid of 96 wt %, nitric acid of 70 wt % and water=1:1:3.

A twelfth aspect of the semiconductor device is a device according to the first aspect, wherein said semiconductor substrate is made of GaAs substrate.

BRIEF DESCRIPTION OF THE DRAWINGS

FIG. 4 is a view showing a related art for explaining the first embodiment of the present invention.

FIG. 5 is a cross sectional view showing a semiconductor device according to the first embodiment of the present invention.

DESCRIPTION OF THE PREFERRED EMBODIMENTS

Embodiment 1

First, prior to explaining a first embodiment of the present invention, referring to FIGS. 1(a)–4, we will explain related arts. In order to form a via hole with a small occupying area, a technique is adopted for a GaAs substrate with an electrode pad patterned on its front surface, which forms an opening with a high aspect ratio from the back surface thereof by anisotropic dry etching and deposits an Au film on the internal wall of the opening.

Figure 1A:
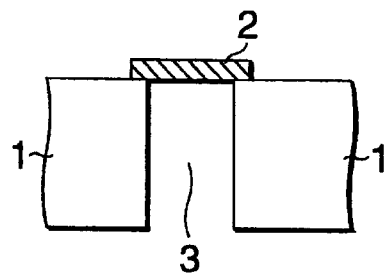
FIGS. 1(a) and 1(b) are views necessary to explain the first embodiment of the present invention.

FIG. 1(a) shows an example of an IC substrate in which an opening 3 having a high aspect ratio (1.0 or more) is formed to penetrate through a GaAs substrate 1 from the front surface to the back surface and a conductive Au film 4 is stacked within the opening 3 to form via hole 3a.

As shown in FIG. 1(a), on the front surface of the GaAs substrate 1 having a thickness of 100 $\mu$m, a Ti film and an Au film are deposited successively and patterned to make an electrode pad 2 having a size of about 90 $\mu$m in a horizontal direction in the sectional view. The electrode pad is connected to e.g. GND. Next, on the back surface of the GaAs substrate 1 with the electrode pad 2 formed, a resist pattern of a negative-type photoresist is formed which has an opening pattern corresponding to an opening 3 in which a via hole 3a is to be formed. Using this resist pattern as an etching mask, the GaAs substrate 1 is subjected to anisotropic dry etching until the bottom of the electrode pad 2 is exposed, thus making the opening 3. Subsequently, the resist pattern used as the etching mask is removed. When the opening 3 is made so as to have a diameter of 60 $\mu$m, the aspect ratio of the opening 3 is about 1:7. In the case that the opening constituting the via hole is formed by wet etching as in the prior art, the opening having a diameter about twice as large as the thickness of the GaAs substrate 1 is formed on the back surface of the GaAs substrate 1. On the other hand, in accordance with this technology (anisotropic dry etching) used in the first embodiment, the opening 3 having a high aspect ratio is formed so that the occupying area can be reduced to a factor of a few of that in the prior art. In the present invention, the high aspect ratio refers to a value of 1 or more and the upper limit is about 10/3. The aspect ratio is determined depending on the processing technique for forming the opening constituting the via hole.

Figure 1B:
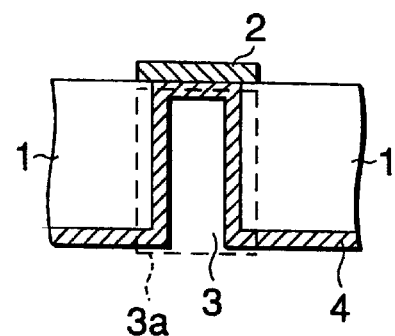

As shown in FIG. 1(b), the back surface of the GaAs substrate 1 is Au-plated and the back surface of the electrode pad 2 located at the inner wall and bottom of the opening 3 is also Au-plated, thus providing the via hole 3a.

By forming the opening 3 having a high aspect ratio, the resultant size of the via hole 3a in a horizontal direction can be reduced to a factor of a few of that in the prior art.

Figure 2:
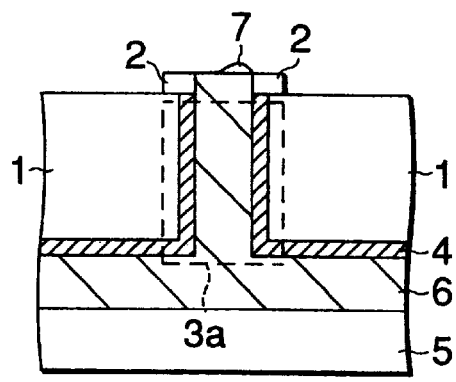
FIG. 2 is a view showing a related art for explaining the first embodiment of the present invention.

However, when the IC substrate having the via hole 3a as shown in FIG. 1(b) is subjected to die bonding, the following problem occurs. As shown in FIG. 2, where the inner wall of the via hole 3a is not covered with Ni, in a die bonding process of bonding the IC substrate to the package substrate 5, AuSn solder is filled within the via hole 3a. Then, heating at 300° C. or so leads to "solder upheaval" that the AuSn solder 6 is also precipitated on the surface of the electrode pad 2 (the solder upheaval area is indicated by reference numeral 7).

Although the conductive Au film 4 is able to be plated to the inner wall of the opening 3 having a high aspect ratio into which the via hole 3a is formed, the Ni film could not be selectively plated by the conventional Ni plating technique.

It is premised in the conventional technique that application of a condition of a low electrolytic current density is required for the plating within a blind hole (the one end closed) which is an opening with a high aspect ratio. However, in the case of the electrolytic Ni plating, the standard hydrogen potential in the electrode reaction of Ni, $U_H$=−0.250 V and that of hydrogen $U_H$=±0 V, and Ni is located at a more base side than H. For this reason, in a range of a low electrolytic current density and voltage, the latter reduction reaction occurs preferentially so that the Ni film could not be grown.

Figure 3A:
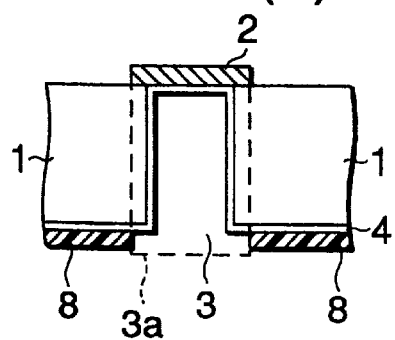
FIGS. 3(a) and 3(b) are views showing a related art for explaining the first embodiment of the present invention.
Figure 3B:
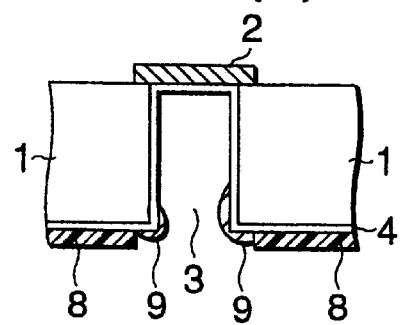

This is problematic in the case of the Ni alloy non-electrolytic plating in view of the following fact. First, as shown in FIG. 3(a), for the substrate to be processed (hereinafter, the IC substrate in the process of manufacture is referred to as the substrate), the resist pattern 8 of a negative-type photoresist is formed so as to cover the other area than the via hole 3a. Subsequently, as shown in FIG. 3(b), a Ni film 9 is formed on the back surface of the GaAs substrate 1 by a common Ni-alloy non-electrolytic plating technique. In this case, the Ni film 9 is deposited at only the open end of the opening 3, but not deposited in the inner wall of the opening 3.

The plating at this time will be described below in more detail.

FIG. 4 shows Equations (1) to (5) in the Ni alloy non-electrolytic plating (containing phosphorus).

The substrate is immersed in a Ni plating solution and is placed under a condition of low electrolytic current density.

As understood from Equation (1), hypophosphite ions are resolved under the presence of Pd catalyst so that the phosphoric acid ions and atomic hydrogen are generated. The phosphoric acid ions are combined with water as expressed by Equation (2).

As expressed by Equation (3), the atomic hydrogen generated as expressed by Equation (1) is adsorbed to Pd and activated so that the Ni ions existing in the plating solution as nickel sulfate are reduced. The metallic Ni thus created grows on Pd which is catalyst. Then, sulfuric acid is created as a by-product in the plating solution.

As expressed by Equation (4), hypophosphite ions are reduced by the activated atomic hydrogen and are combined with Ni to provide a Ni-P alloy plating film.

Otherwise, as expressed by Equation (5), the hypophosphite ions are resolved by an catalytic operation to create molecular hydrogen. By the generation of the molecular hydrogen, the liquid is stirred in the vicinity of the surface of deposits.

The reactions expressed in Equations (1) to (5) are carried out normally in the portion where the plating solution is sufficiently stirred. On the other hand, in the portion where the plating solution is not sufficiently stirred, the value of pH of the plating solution within the sulfuric acid, which is created simultaneously when reduction of Ni is performed in the reaction expressed in Equation (3), becomes small. Thus, as expressed by Equation (6), Ni is ionized to create molecular hydrogen so that the Ni film 9 does not further grow.

Where the flat entire back surface of the GaAs substrate 1 except the via hole is subjected to the non-electrolytic Ni plating, the micro-stream which is caused by generation of molecular hydrogen by the reaction of Equation (5) provides a sufficient stirring effect for the plating solution. However, if less molecular hydrogen is generated, the interior of the opening (blind hole) having a high aspect ratio like the opening 3 formed by dry etching is susceptible to suffer from the adverse effect by shortage of stirring.

As shown in FIG. 3(a), if in the area of the back surface of the GaAs substrate 1 except the via hole 3a, with a resist pattern 9 deposited on the Au film 4, the non-electrolytic plating is carried out, the area where the plating reaction occurs becomes small and hence the stirring of the plating solution based on the creation of the molecular hydrogen does not occur sufficiently. As a result, as shown in FIG. 3(b), Ni will not be created within the opening, but the Ni film 9 will be formed slightly in the opening in the vicinity of the back surface of the Ga ps substrate 1.

In order to obviate such a inconvenience, in accordance with this embodiment, a sufficient amount of hydrogen is generated by plating the entire back surface of the GaAs substrate 1 so that the stirring effect of the plating solution is provided, thereby depositing the Ni film having a uniform thickness on the entire inner wall and bottom of the opening 3 on which the via hole 3a is formed.

FIG. 5 is a sectional view of the main part of the semiconductor device according to the first embodiment of the present invention. In FIG. 5, like reference numerals refer to like or corresponding parts described previously.

The semiconductor device shown in FIG. 5 is in a stage where the IC substrate has been die-bonded to the package substrate 5 using the AuSn solder 6. Since an Ni film 9a (properly speaking, Ni alloy non-electrolytic plating film) has been deposited on the inner wall of the opening constituting the via hole 3a, the AuSn solder 6 is not filled in the via hole 3a so that the IC substrate and the package substrate 5 can be preferably bonded to each other.

An explanation will be given of the process of manufacturing the semiconductor device having a structure shown in FIG. 5.

As shown in FIG. 1 described previously, an electrode pad 2 is formed on the front surface of a GaAs substrate 1 having a thickness of about 100 μm. The GaAs substrate 1 is subjected to the anisotropic dry etching from the back surface thereof at the area corresponding the electrode pad 2 until the bottom face of the electrode pad 2 is revealed, thereby making a cylindrical opening 3 having a diameter of about 60 μm.

As shown in FIG. 1(b) described previously, an Au film 4 having a thickness of about 0.5 μm is plated on the entire back surface inclusive of the inner wall and bottom of the opening 3 of the GaAs substrate 1. The portion located within the opening 3 of the deposited Au film 4 substantially serves as the via hole 3a.

Figure 6A:
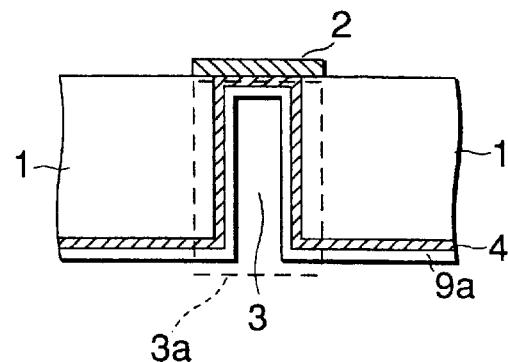
FIGS. 6(a)–6(d) are views showing a method of manufacturing the first embodiment according to the present invention.

As shown in FIG. 6(a), the Ni alloy non-electrolytic plating is carried for the entire back surface of the GaAs substrate 1 so that the Ni film 9a having a thickness of about 0.5 μm.

Then, with no mask on the back surface of the GaAs substrate 1, plating is performed for the entire back surface thereof. Therefore, as understood from Equation (5) of FIG. 4, a larger amount of molecular hydrogen gas is generated than in the case where the plating is selectively performed for only the vicinity of the via hole 3a. The micro-stream thus created can be introduced into the opening 3 constituting the via hole 3a so that the plating solution can be stirred sufficiently. Thus, the Ni film 9a can be deposited as a film having a uniform thickness on the entire surface of the GaAs substrate 1 inclusive of the inner wall and bottom of the opening 3 on which the via hole 3a is formed.

The Ni film 9a thus deposited, more properly, Ni alloy non-electrolytic plating film, may be an Ni—P film containing phosphorous, Ni—B film containing boron, Ni—B—W film further containing W, etc.

In the Ni alloy non-electrolytic plating solutions which are commercially available, sodium hypophosphite is used for deposition of the Ni—P film as a reducing agent, and boric acid is used for deposition of the Ni—B film as the reducing agent. Where the Ni alloy film containing W is to be deposited, the plating solution containing a tungsten compound is used to facilitate inductive eutectic reaction, thus providing the Ni alloy non-electrolytic film containing W.

Incidentally, the front surface of the GaAs substrate 1 with the electrode pad 2 formed is covered with a mask in a previous state prior to the plating processing so that the Ni film 9a is not deposited like the back surface. After deposition of the Ni film 9a, the mask is removed.

Figure 6B:
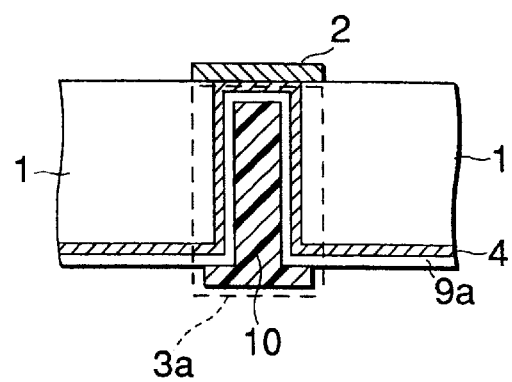

As shown in FIG. 6(b), a resist pattern 10 of positive photoresist is formed on the Ni film 9a located at the area where the via hole 3a is to be formed in the back surface of the GaAs substrate 1. The resist pattern 10 has a diameter of about 90 μm in the horizontal direction, and can mask the opening having a diameter of 60 μm.

Figure 6C:
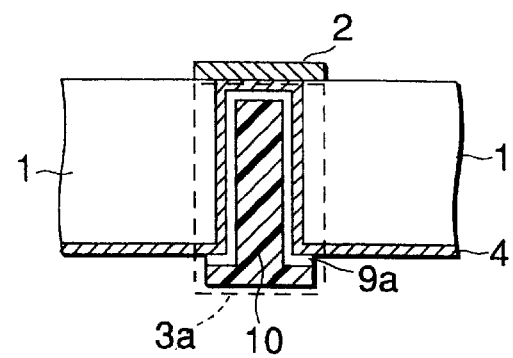

As shown in FIG. 6(c), using the resist pattern 10 as an etching mask, the Ni film 9a except the via hole 3a is etched away by sulfuric/nitric acid (sulfuric acid of 96 wt %, nitric acid of 70 wt % and water=1:1:3). Thus, the Ni film 9 is selectively left on only the surface of the via hole 3a. By using, as an etchant, the sulfuric/nitric acid having the ratio of 1:1:3 composed of the sulfuric acid (96 wt %) serving as an oxidation agent, nitric acid (70 wt %) serving as solvent for stably dissolving Ni and pure water serving as diluent, at a room temperature, the solution-retarded Ni alloy non-electrolytic plating film such as Ni—P, Ni—B, etc,. can be etched at the rate of 2500 A/min.

Figure 6D:
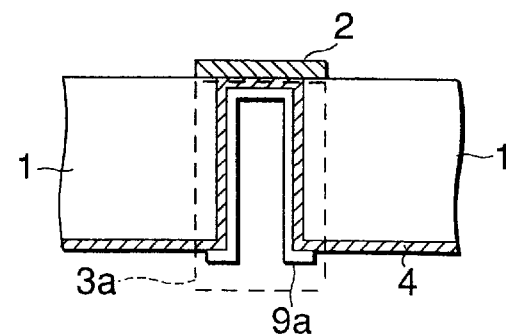

Thereafter, as shown in FIG. 6(d), the resist pattern 10 is removed to provide the IC substrate.

In the above explanation, at the processing stages of FIGS. 6(c) to 6(d), using the resist pattern 10 as the etching mask, the sulfuric/nitric acid was used as an etchant to etch the Ni film 9a selectively. However, the Ni film 9a can be also etched selectively by the ion milling technique.

The IC substrate, on the surface of which elements required for the IC have been formed, is bonded to the package substrate 5 using the AuSn solder 6 to complete the semiconductor device having a sectional structure as shown in FIG. 5.

In this case, the AuSn solder 6 and the Ni film 9 having poor wetting therefor are not in contact with each other, and the Au film 4 of the GaAs substrate 1 and the AuSn solder 6 are in an intimate contact with each other. Therefore, the AuSn solder 6 is not filled into the via hole 3a so that the "solder upheaval" phenomenon does not occur.

Since the via hole 3a is previously formed in the cylindrical opening 3 formed by the anisotropic etching, the thickness of the GaAs substrate 1 does not become locally small as compared with the prior art case where the via hole is formed in the opening by the wet etching. This permits the problem of occurrence of cracks to be solved, thus completing a semiconductor device having an improved structure.

In this way, by depositing the Ni alloy non-electrolytic plating film (Ni film 9a) on the entire back surface of the GaAs substrate 1 after the Au film 4 has been deposited in the via hole 3a, it can be deposited in a preferable state in the opening 3a having a high aspect ratio. The Ni film 9a at an unnecessary area except the via hole 3a can be etched away using the sulfuric/nitric acid (etchant) described above, or ion milling.

Thus, also in the die bonding of the IC substrate with the via hole 3a thus formed, the solder upheaval phenomenon can be suppressed and no crack is generated so that the semiconductor device having a preferable shape can be provided.

Figure 20A:
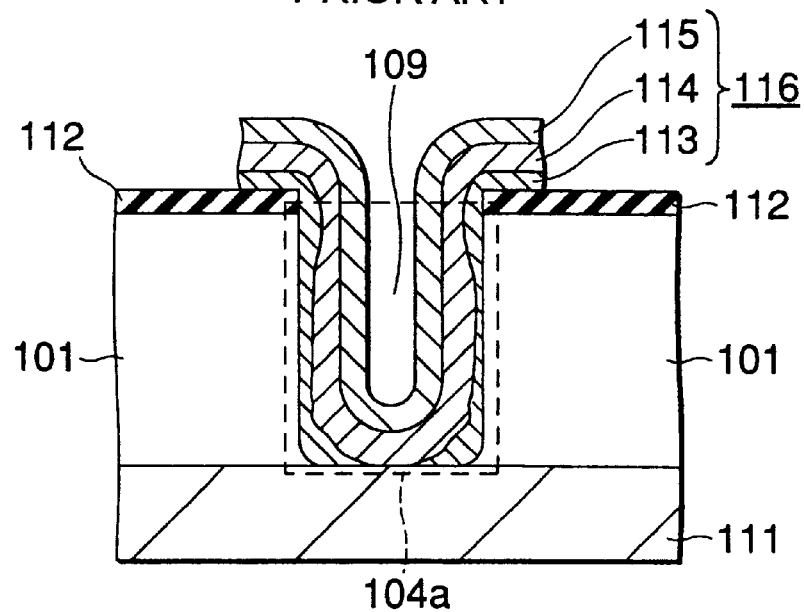
FIG. 20(a) and 20(b) are views showing a prior art.
Figure 20B:
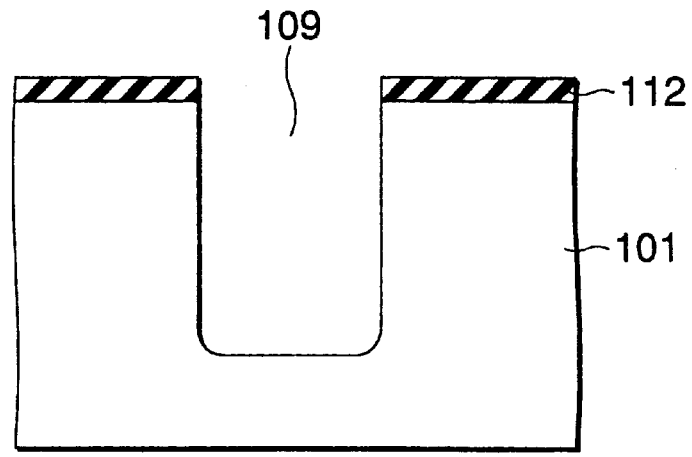

As described above, in making the opening 3 having a high aspect ratio, with the electrode pad 2 formed in advance on the GaAs substrate 1 at the area where the via hole 3a is located, the GaAs substrate 1 is dug from the back surface to the front surface thereof at a stretch by etching. For this reason, as compared with the prior art explained referring to FIGS. 20(a) and 20(b), the number of steps for manufacturing the semiconductor device (e.g the number of times of etching for the GaAs substrate 1 such as etching the entire surface of the GaAs substrate 1) can be reduced.

Since the opening 3 where the via hole 3a is formed by the anisotropic dry etching is opened, the via hole having a small occupying area can be formed.

Further, in the first embodiment, where the thickness of the GaAs substrate 1 is 100 μm, the opening having a diameter of 60 μm has been formed by anisotropic dry etching. However, where the thickness of the GaAs substrate is 100 μm, the opening may have a diameter of 30 μm or so in order to form a sufficiently improved via hole.

Accordingly, it can be seen that all of the occupying area, shape and electric characteristic of the via hole are preferable with the aspect ratio of the opening in which the via hole is to be formed is within a range from 1 to 10/3.

With the opening diameter of 30 μm, the range of the aspect ratio can be adopted which permits the same shape as the via hole 3a shown in FIG. 5 to be physically formed.

In the above explanation, the shape of the opening 3 was mainly cylindrical. But the opening shape in the horizontal direction may not be completely circular, but may be elliptical or cylindrical-column-shaped.

There are typical film thicknesses of 350 μm, 150 μm, 100 μm and 30 μm of the GaAs substrate. Among them, the thicknesses of the GaAs substrate suitable to form the via hole are 150 µm, 100 µm and 30 µm. However, from the point of view of actually forming the opening by anisotropic dry etching, only the GaAs substrate having a thickness of 100 µm or 30 µm can be applied to the technique of the first embodiment. The GaAs substrate having a thickness of 30 µm can be also processed in the same manner as in the case where the via hole is formed for the GaAs substrate having a thickness of 100 µm, thereby manufacturing a semiconductor substrate having a small occupying area and a good shape and electric characteristic.

The structure of the via hole according to the present invention can be applied to not only to the IC substrate (inclusive of the structures explained with reference to the second embodiment et seq.) but also an FET (Field Effect Transistor).

Embodiment 2

In the first embodiment, the via hole 3a was formed in the opening 3 formed by anisotropic dry etching providing a high aspect ratio, the Au film 4 was deposited on the entire back surface of the GaAs substrate 1, and the Ni film 9a was formed at only the area of the via hole 3a.

In the second embodiment, an explanation will be given of a semiconductor device having a via hole formed in the opening with a high aspect ratio, in which the Ni film constituting the via hole is deposited on not only the area of the via hole but also the entire back surface of the GaAs substrate.

Figure 7:
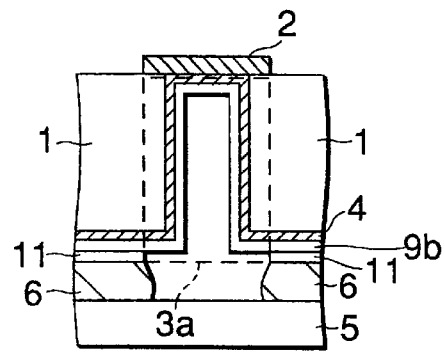
FIG. 7 is a view showing a semiconductor device according to the second embodiment of the present invention.
Figure 8A:
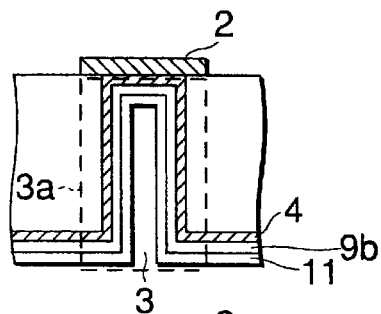
FIGS. 8(a)–8(d) are views showing a method of manufacturing the second embodiment according to the present invention.
Figure 8B:
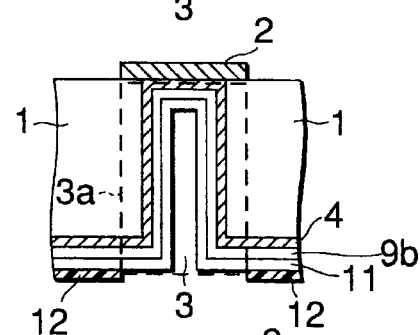
Figure 8C:
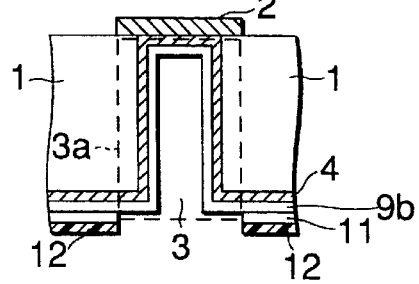
Figure 8D:
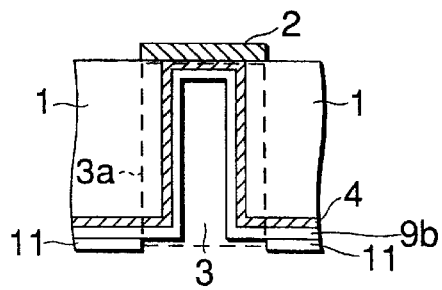

FIG. 7 is a sectional view of the main part of the semiconductor device according to the second embodiment. In FIG. 7, reference numeral 11 denotes an Au film deposited on the surface of the area of the Ni film 9 except the region where the via hole 3a is formed. Like reference numerals refer to like or corresponding parts described previously.

As shown in FIG. 7, the semiconductor device according to the second embodiment is characterized in that a via hole 3a is formed from the front surface of the GaAs substrate 1 to reach the back surface thereof; at the area where the via hole 3a is formed, a two-layer structure is taken which is composed of the Au film having a thickness of 0.5 µm and an Ni film 9b having a thickness of about 0.5 µm stacked thereon as in the first embodiment; and at the back surface of the GaAs substrate 1 except the area of the via hole 3a, a three-layer structure including another Au film 11 in addition to the Au film 4 and Ni film 9b is taken. The Au film 11 has a thickness of 2.0 µm.

An explanation will be given of a method of manufacturing a semiconductor device as shown in FIG. 7.

First, the GaAs substrate 1 is processed in the same manner until the step of FIG. 6(*a*) explained in connection with the first embodiment. Subsequently, an Au film 4 constituting a via hole 3a and an Ni film 9b (Ni film 9a in FIG. 6(*a*)) which is an Ni alloy non-electrolytic plating film are deposited on the entire back surface of the GaAs substrate 1 inclusive of the internal wall and bottom of the opening 3 thereof.

As shown in FIG. 8(*a*), the Au film 11 is stacked on the surface of the Ni film 9b by plating so that it has a thickness of about 2.0 µm.

As shown in FIG. 8(*b*), a resist pattern 12 of positive type photoresist having an opening pattern corresponding to an area occupied by the via hole 3a is patterned on the back surface of the GaAs substrate 1.

As shown in FIG. 8(*c*), using the resist pattern 12 as an etching mask, the Au film 11 is selectively etched to remove the Au film 11 located at the area where the via hole 3a is formed.

As shown in FIG. 8(*d*), the resist pattern 12 used as the etching mask is removed to provide an IC substrate.

Thus, the via hole 3a can be formed within the IC substrate.

Thereafter, by bonding the back surface of the IC substrate to the front surface of the package substrate 5 by using the AuSn solder 6, the semiconductor device as shown in FIG. 7 can be provided.

In this way, in die bonding, with the Ni film 9b exposed to the surface layer of the via hole 3a, the IC substrate can be bonded to the package substrate 5. Therefore, the AuSn solder 6 is not filled into the via hole 3a, thereby providing a semiconductor device having an improved shape with no "solder upheaval".

Since the opening 3 into which the via hole 3a is to be formed is formed by anisotropic dry etching, the thickness of the GaAs substrate 1 will not become small, thus suppressing the occurrence of cracks. It is needless to say that the via hole 3a with a small occupying area can be formed.

In the above explanation, although the GaAs substrate 1 having a thickness of 100 µm was used, the GaAs substrate having a thickness of 30 µm may be processed in the same manner so that the semiconductor device with a via hole having a small occupying area.

Embodiment 3

Figure 9:
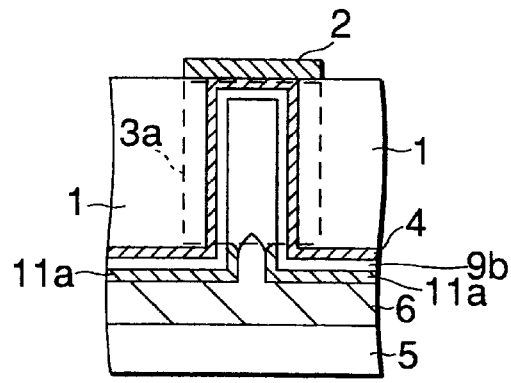
FIG. 9 is a view showing a semiconductor device according to the third embodiment of the present invention.

FIG. 9 is a sectional view of the main part of the semiconductor device according to the third embodiment. In FIG. 9, reference numeral 11a denotes an Au film deposited by evaporation. The Au film is mainly deposited on the flat portion of the back surface of the GaAs substrate 1 and not almost deposited in the via hole 3a. In FIG. 9, like reference numerals refer to like or corresponding parts explained previously.

In order to obtain the semiconductor device as shown in FIG. 9, the GaAs substrate is processed in the same manner as the method of manufacturing the semiconductor device as shown in FIG. 6(*a*) in connection with the first embodiment. The via hole 3a is formed by plating the Au film 4 and the Ni film 9b (FIG. 6(*a*)) on the entire back surface of the GaAs substrate 1 having a thickness of 100 µm so that they have a thickness of 0.5 µm, respectively.

Figure 10:
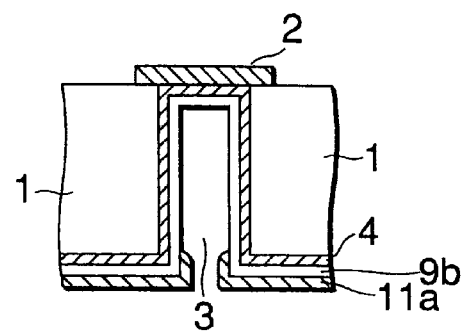
FIG. 10 is a view showing a method of manufacturing the third embodiment according to the present invention.

Thereafter, as shown in FIG. 10, an Au film 11a is deposited on the entire back surface of the GaAs substrate 1 so that a three-layer structure composed of the Au film 4, Ni film 9b and Au film 11a which have been successively stacked is provided on the back surface of the GaAs substrate 1. On the other hand, in the inner wall and bottom of the opening 3 made from the back surface of the GaAs substrate 1, a two-layer structure composed of the Au film 4 and the Ni film 9b successively stacked is formed.

The Au film 11a deposited by evaporation method is formed to be thin only on the back surface of the GaAs substrate 1 and in the vicinity of the opened end of the opening 3, and is not deposited within the opening 3. The IC substrate with the Ni film 9b exposed within the opening 3 can be obtained.

Thereafter, in die bonding, the AuSn solder 6 is not filled in the opening 3. Thus, the semiconductor device having an improved shape with no fear of "solder upheaval" can be obtained.

Since the opening 3 is made by anisotropic dry etching, the via hole 3a having a small occupying area can be obtained. Since the thickness of the GaAs substrate will not be locally small, occurrence of cracks can be suppressed.

In the above explanation, although the GaAs substrate 1 having a thickness of 100 µm was used, the GaAs substrate having a thickness of 30 µm may be processed in the same manner so that the semiconductor device with a via hole having a small occupying area can be obtained.

Embodiment 4

In the first to third embodiments, the opening 3 in which the via hole 3a is formed a cylindrical shape with a high aspect ratio.

In the semiconductor device according to this embodiment, the via hole is not formed in the opening formed in a cylindrical shape, but is formed in the opening with the diameter changing in at least two stages so that the diameter is relatively large in the vicinity of the back surface of the GaAs substrate 1 and is relatively small in the vicinity of the front surface thereof.

Figure 11:
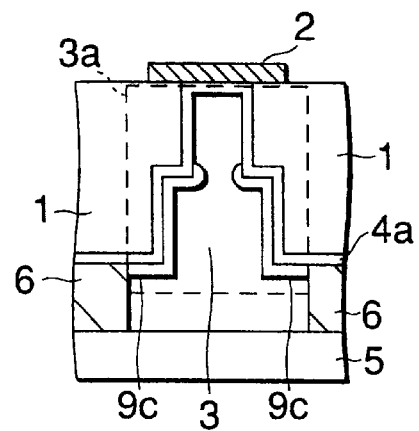
FIG. 11 is a view showing a semiconductor device according to the fourth embodiment of the present invention.

The main part of the semiconductor device according to the fourth embodiment is shown in FIG. 11.

In FIG. 11, the opening 3 in the GaAs substrate 1 having a thickness in which the via hole 3a is formed has a diameter changing in two stages composed of a first cylindrical shape having a diameter of 100 $\mu$m (large diameter) from the back surface of the GaAs substrate to the depth of about 50 $\mu$m thereof, and a second cylindrical shape having a diameter of 60 $\mu$m (small diameter) from the depth of 50 $\mu$m, which corresponds to the bottom of the first cylindrical shape having the large diameter, to the front surface of the GaAs substrate 1.

In FIG. 11, reference numeral 4a denotes an Au film stacked with a uniform thickness on the inner wall and bottom of the opening 3 having the two-stage diameters and the back surface of the GaAs substrate 1. Reference numeral 9c denotes a Ni film selectively deposited on the inner wall and bottom of the opening 3 having a larger diameter of about 100 $\mu$m on the surface of the Au film 4a and area (in the vicinity of the outer periphery of the opening 3) included in the via hole 3a on the back surface of the GaAs substrate 1. Other like reference numerals refer to like or corresponding parts.

The semiconductor device shown in FIG. 11 is characterized in that in the area with the opening 3 with a diameter of 60 $\mu$min which the via hole 3a is formed, the via hole 3a is constructed by only the Au film, and within the opening 3 having a diameter of 100 $\mu$m and on the periphery of the opening 3 on the back surface of the GaAs substrate 1 (range included in a circle having a diameter of 130 $\mu$m drawn at the center of the same point as for the other opening diameter), the via hole 3a is constructed by a two-layer structure of the Au film 4a and the Ni film 9c stacked on the surface.

An explanation will be given of a method of manufacturing a semiconductor device as shown in FIG. 11.

Figure 12A:
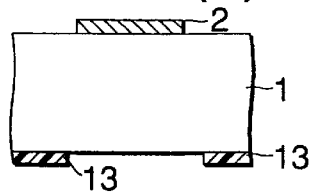
FIGS. 12(a)–12(j) are views showing a method of manufacturing the fourth embodiment according to the present invention.

First, as shown in FIG. 12(a), a Ti film and an Au film are successively stacked on the surface of the GaAs substrate 1 constituting the IC substrate, and these films are patterned into a shape of an electrode pad 2 having a square with one side of about 90 $\mu$m. On the back surface of the GaAs substrate 1 with the electrode pad 2 thus formed, a resist pattern 13 of a positive type photo-resist which is an opening pattern having a diameter of 100 $\mu$m is formed.

Figure 12B:
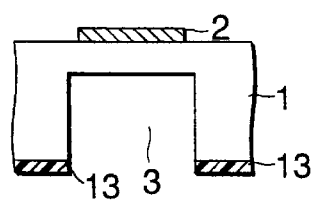

As shown in FIG. 12(b), the GaAs substrate 1 is subjected to anisotropic dry etching using the resist pattern 13 as an etching mask so that an opening 3 is formed which has a shape dug from the back surface of the GaAs substrate 1 to the depth of about 50 $\mu$m (about half of the thickness of the GaAs substrate 1).

Figure 12C:
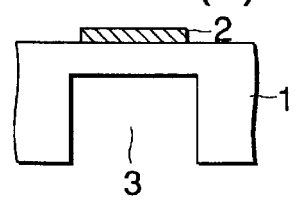

Thereafter, the resist pattern 13 is removed as shown in FIG. 12(c).

Figure 12D:
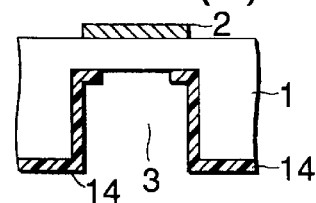

As shown in FIG. 12(d), a resist pattern 14 which is an opening pattern having a thickness of 60 $\mu$m is formed at the center the electrode pad 2 and opening 3 on the back surface of the GaAs substrate 1.

Figure 12E:
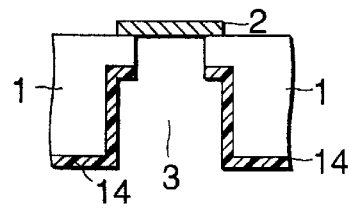

Therefore, as shown in FIG. 12(e), the GaAs substrate 1 is subjected to anisotropic dry etching using the resist pattern as an etching mask so that a cylindrical opening having a diameter of 60 $\mu$m is newly formed, thus forming the opening 3 penetrating through the GaAs substrate 1 and having a diameter changing in two stages.

Figure 12F:
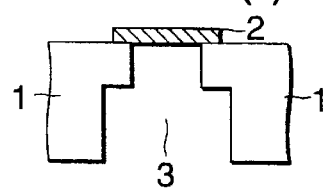

As shown in FIG. 12(f), the etching pattern 14 used as the etching mask is etched away.

Figure 12G:
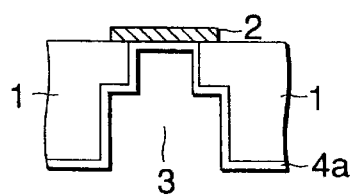

As shown in FIG. 12(g), the bottom of the GaAs substrate 1 is plated with Au to form an Au film 4a having a thickness of about 0.5 $\mu$m.

Figure 12H:
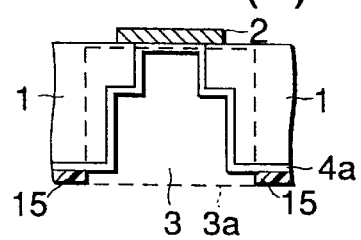

Therefore, as shown in FIG. 12(h), a resist pattern 15 which is an opening pattern corresponding to an area having a diameter of 130 $\mu$m including the opening 3 is formed. The area where the resist pattern 15 is formed constitutes a via hole 3a.

Figure 12I:
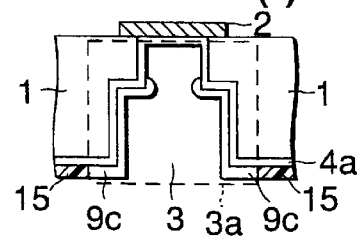

As shown in FIG. 12(i), an Ni film 9a is formed on the bottom of the GaAs substrate 1 by general Ni plating techniques. This Ni film 9c may be deposited by electrolytic plating techniques. Further, the Ni film 9c can be formed by Ni alloy non-electrolytic plating. In this case also, as described above, since the area not corresponding to the via hole 3a on the back surface of the GaAs substrate 1, the Ni film 9b is not plated within the small opening having a diameter of about 60 $\mu$m, and it is selectively plated within the large opening having a diameter of about 100 $\mu$m and on the back surface of the GaAs substrate 1 corresponding to the via hole 3a.

Figure 12J:
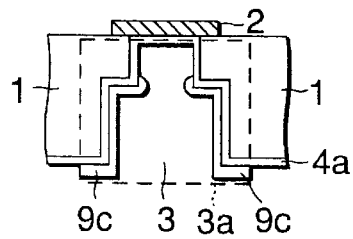

Thereafter, as shown in FIG. 12(j), the resist pattern 15 is removed, thus completing the IC substrate.

After having undergone the die bonding step, the semiconductor device as shown in FIG. 11 can be obtained.

In the semiconductor device formed as shown in FIG. 11, the Ni film 9c can be deposited at the area having a diameter of 100 $\mu$m or more in close vicinity to the back surface of the GaAs substrate 1 in the opening 3 at the region corresponding to the via hole 3a.

Therefore, after formation of the Ni film 9c, only undergoing the step of removing the resist pattern formed on the back surface of the GaAs substrate 1, the manufacturing process can proceed to the step of die bonding.

In the die bonding also, as in the embodiments described above, the phenomenon of "solder upheaval" and occurrence of cracks can be suppressed. As for the occupying area, the size of the via hole 3a in the horizontal direction can be made 130 $\mu$m at most, and the maximum diameter of the opening 3 can be made relatively as small as 100 $\mu$m.

In the above explanation, the shape of the opening 3 was mainly cylindrical. But the opening shape in the horizontal direction may not be completely circular, but may be elliptical or cylindrical-column-shaped.

In the above explanation, although the small diameter of the opening 3 in which the via hole 3a is formed was 60 $\mu$m, the diameter of 25–60 $\mu$m can be adopted to obtain the semiconductor device having the same effect. The lower limit is a value which permits the opening in the GaAs substrate to be made and the Au film 4a to be deposited, and can assure the electric characteristic for the via hole.

Embodiment 5

An explanation will be given of the fifth embodiment of the present invention.

Figure 13:
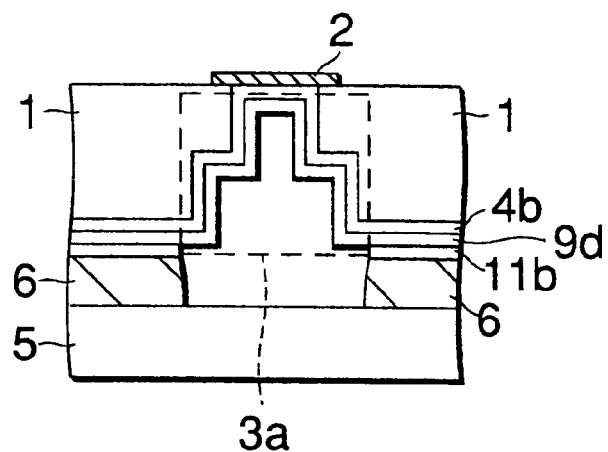
FIG. 13 is a view showing a semiconductor device according to the fifth embodiment.

FIG. 13 is a sectional view of the main part of the semiconductor device according to the fifth embodiment of the present invention. The shape of the opening 3 provided in the GaAs substrate 1 is the same as that of the opening 3 according to the fourth embodiment, and includes openings of a large diameter and a small diameter.

The semiconductor device according to the fifth embodiment is characterized by a conductive film constituting the via hole 3a, i.e, in that the Ni film 9b to be deposited on the back surface of the GaAs substrate 1 and the Ni film (Ni alloy non-electrolytic plating film) 9d are deposited on the entire back surface of the GaAs substrate 1 (inclusive of the inner wall of the opening 3), and at the region except the via hole 3a, the Au film 11b is further stacked on the surface of the Ni film 9d.

In the above explanation, although the GaAs substrate 1 having a thickness of 100 μm was used, the GaAs substrate having a thickness of 30 μm may be processed in the same manner so that the semiconductor device with a via hole having a small occupying area can be obtained.

An explanation will be given of the method of manufacturing a semiconductor device according to this embodiment. In accordance with the process of FIGS. 12(a) to 12(f), an opening 3 having a diameter of 100 μm is formed from the back surface of the GaAs substrate 1 to the depth of about 50 μm. Subsequently, an opening 3 having a diameter of 60 μm which reaches the surface of the GaAs substrate 1 is formed. Thereafter, the Au film 4b is plated on the back surface of the GaAs substrate 1.

Further, in accordance with the manufacturing process of FIGS. 8(a) to 8(d), the Ni film 9d (which corresponds to the Ni film 9b in FIG. 8) is deposited on the entire surface of the Au film 4b, and the Au film 11b is plated on the entire back surface of the GaAs substrate 1. The Au film 11b deposited on the region constituting the via hole 3a is selectively removed, thus providing the IC substrate. After subjecting the IC substrate to die bonding, the semiconductor device as shown in FIG. 13 can be obtained.

In the process as described above, since the Ni film 9d can be selectively exposed on the surface of the region corresponding to the via hole 3a in die bonding, the "solder upheaval" phenomenon due to die bonding can be suppressed. The GaAs substrate 1 can be suppressed from becoming locally thin. For this reason, the via hole 3a having an improved shape can be obtained.

The Ni film 9d constituting the via hole 3a of the semiconductor device according to this embodiment was formed by subjecting the entire back surface of the GaAs substrate 1 to non-electrolytic plating. But, the Ni film 9d can be deposited by general Ni plating techniques. Although the Ni film 9d formed by the general Ni plating techniques is not deposited on the inner wall and bottom of the opening having a small diameter of 60 μm, it is deposited within the opening having a large diameter. Thus, when the die bonding is carried out, the via hole with an improved shape with no "solder upheaval" can be obtained.

Embodiment 6

An explanation will be given of the sixth embodiment of the present invention.

Figure 14:
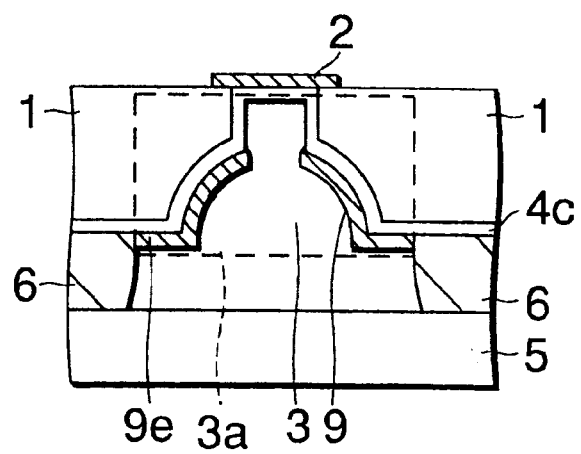
FIG. 14 is a view showing a semiconductor device according to the sixth embodiment.

FIG. 14 is a sectional view of the main part of the semiconductor device according to the sixth embodiment of the present invention.

In FIG. 11, reference numeral 4c denotes an Au film plated on the entire back surface of the GaAs substrate 1. Reference numeral 9e denotes a Ni film selectively plated on the Au film 4c at the area having a diameter of 60 μm or more in the opening in which the via hole 3a is formed. Other like reference numerals refer to like or corresponding parts described previously.

In the fourth and fifth embodiments, the opening 3 in which the via hole 3a is formed has a stepped shape with different diameters of the opening, and was formed by anisotropic dry etching. On the other hand, the opening 3 of the semiconductor device according to this embodiment 6 is formed by a combination of wet isotropic etching and anisotropic dry etching. At the area from the back surface of the GaAs substrate 1 to the depth of half of the thickness of the GaAs substrate 1, the opening having a large diameter (60 μm or more) is formed by the wet isotropic etching, and at the area from the bottom of the opening having a large diameter to the front-surface of the GaAs substrate 1, the opening having a small diameter (60 μm or less) is formed by the anisotropic dry etching.

An explanation will be given of a method of manufacturing a semiconductor device as shown in FIG. 14.

Figure 15A:
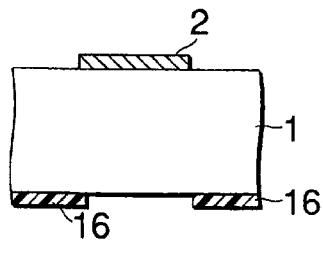
FIGS. 15(a)–15(h) are views showing a method of manufacturing the sixth embodiment according to the present invention.

First, as shown in FIG. 15(a), an electrode pad 2 is patterned on the surface of the GaAs substrate 1. At the area corresponding to the electrode pad 2 on the back surface of the GaAs substrate 1, a resist pattern 16 with an opening having a diameter of 60 μm is patterned.

Figure 15B:
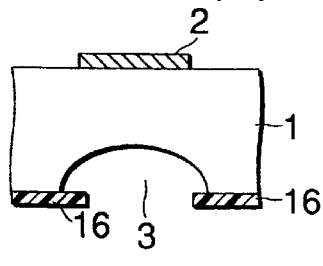

Therefore, as shown in FIG. 15(b), using the resist pattern 16 as an etching mask, the GaAs substrate 1 is subjected to the wet isotropic etching so that it is etched to the position of about half of its film thickness. Because of the isotropic etching, the diameter of the opening 3 on the back surface of the GaAs substrate 1 is 110 μm or so.

Figure 15C:
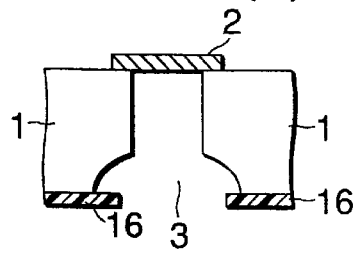
Figure 15D:
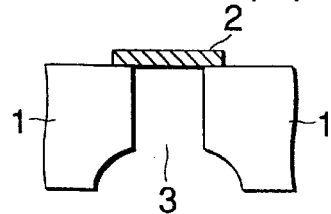

As shown in FIG. 15(c), using, as an etching mask, the resist pattern 16 used in the previous wet isotropic etching, the GaAs substrate is subjected to the anisotropic dry etching so that a cylindrical opening having a diameter of 60 μm is formed from the position of about half of the film thickness of the GaAs substrate 1 to the front surface thereof. Thus, the bottom face of the electrode pad 2 patterned on the front surface of the GaAs substrate 1 is exposed.

Then, the opening 3 has a shape becoming small gradually from the back surface of the GaAs substrate 1 to the position of half of the thickness thereof, and from there to the front surface of the GaAs substrate 1 the opening having a small diameter of 60 μm is formed.

The resist pattern 16 used as an etching mask is removed.

Figure 15E:
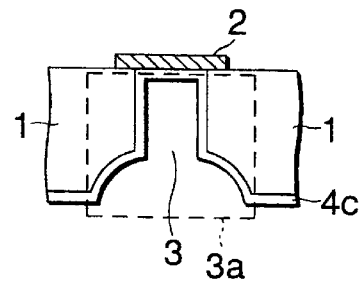
Figure 15F:
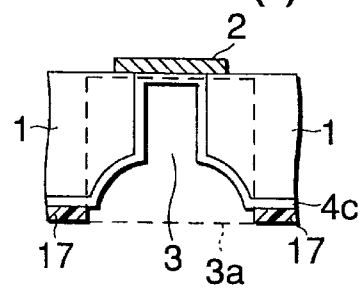
Figure 15G:
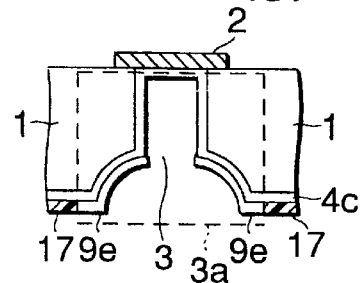
Figure 15H:
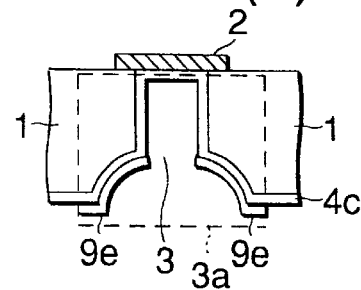

Thereafter, as shown in FIG. 15(e), the Au film 4c is plated on the entire back surface of the GaAs substrate 1 inclusive of the inner wall and bottom of the opening 3. The Au film 4c is formed to have a thickness of 0.5 μm or so.

Figure 17:
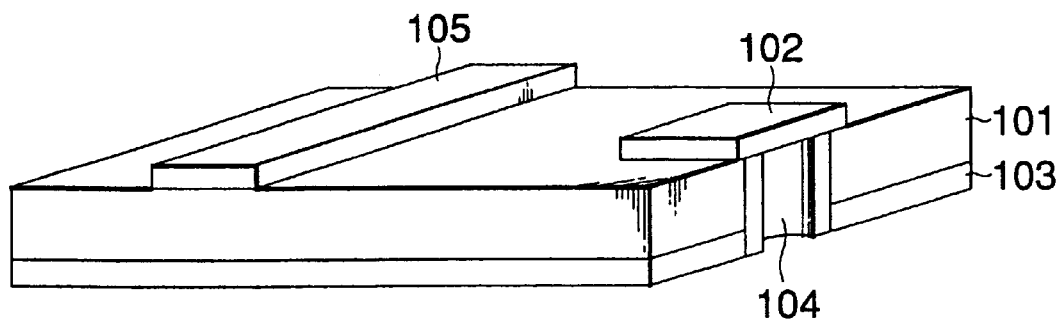
FIG. 17 is a view showing a prior art.
Figure 18:
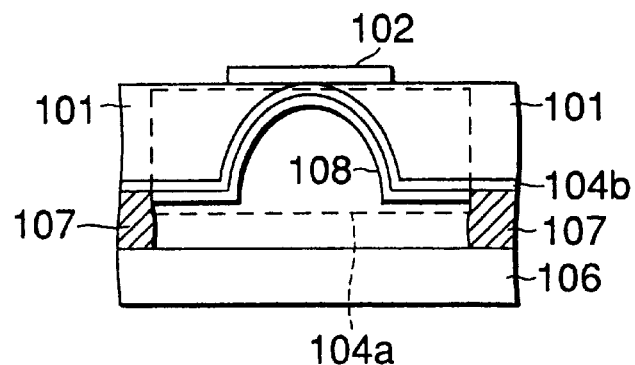
FIG. 18 is a view showing a prior art.
Figure 19A:
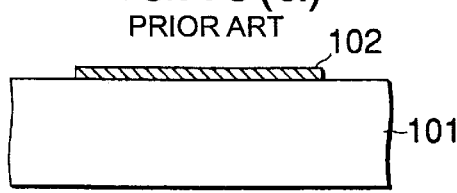
FIG. 19(a)–19(h) are showing a prior art process.
Figure 19E:
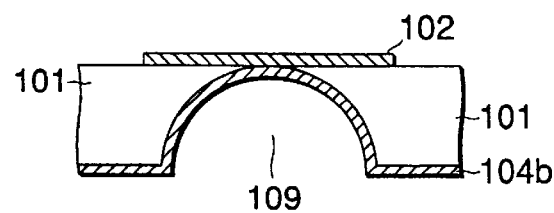
Figure 19B:
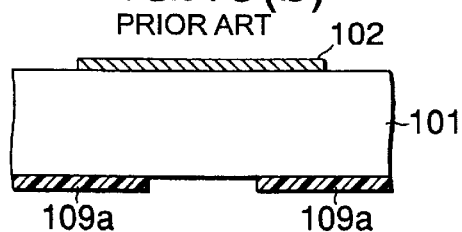
Figure 19F:
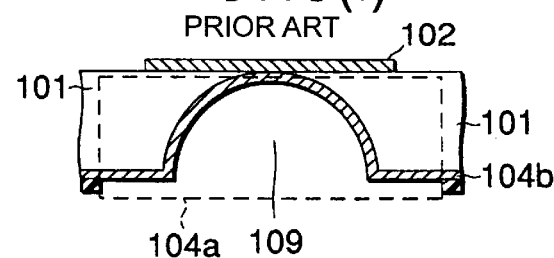
Figure 19C:
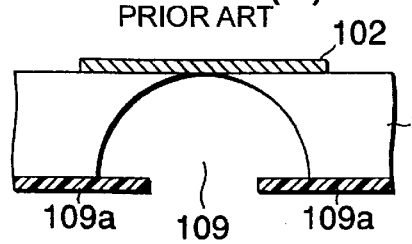
Figure 19G:
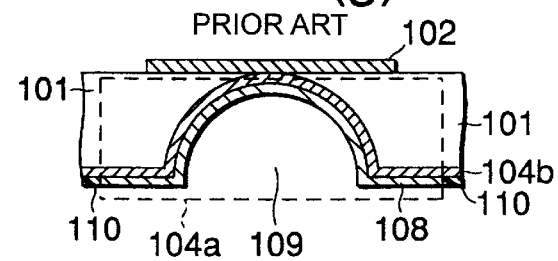
Figure 19D:
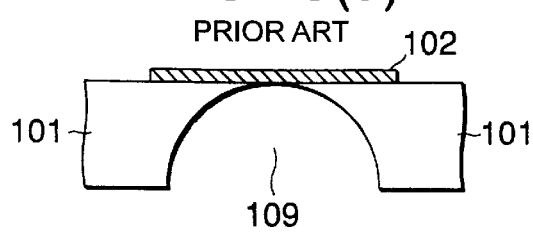
Figure 19H:
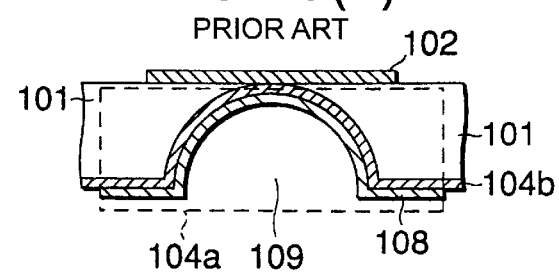

As shown in FIG. 17(f), a resist pattern 17 is patterned on the area except the region of the via hole 3a on the back surface of the GaAs substrate 1. The region constituting the via hole 3a refers to an area including the opening 3 and having a diameter of 150 μm.

Thereafter, using the resist pattern as a mask, a Ni film (Ni alloy non-electrolytic plating film) 9e is plated on the back surface of the GaAs substrate 1.

In the plating step, the back surface of the GaAs substrate is not entirely plated with the Ni film 9e. Specifically, even if the GaAs substrate 1 is processed in a state where the area corresponding to the via hole 3a is completely immersed in a Ni plating solution, the Ni film 9e is not deposited on the inner wall and bottom of the opening 3 having a small diameter made by anisotropic dry etching, but selectively deposited on the inner wall and bottom of the opening having a large diameter made by the wet isotropic etching and on the region on the outer periphery of the opening 3 on the back surface of the GaAs substrate 1 and corresponding to the via hole 3a.

Thereafter, the resist pattern 17 used as a mask is removed, thereby completing the IC substrate.

The exposed portion of the Au film 4c on the back surface of the IC substrate is bonded to the package substrate 5 through the AuSn solder 6 to complete the semiconductor device as shown in FIG. 14.

In the semiconductor device thus formed, the area occupied by the via hole 3a is relatively as small as that occupied by the diameter of 150 $\mu$m. In addition, the Ni film 9e is selectively deposited at the region with the opening having a diameter of 60 $\mu$m or more. For this reason, in die bonding, the AuSn solder 6 is not filled within the opening 3a, thereby permitting the "solder upheaval" to be suppressed.

In this sixth embodiment, the opening 3 is formed by the anisotropic dry etching as well as the wet isotropic etching. Therefore, in the vicinity of the front surface of the GaAs substrate 1, the opening has a cylindrical shape so that the GaAs substrate 1 is not locally thin, thereby suppressing occurrence of cracks.

In the process of manufacturing a semiconductor device according to the present invention, the resist pattern 16 which is an etching mask used for the opening 3 can be used in the wet isotropic etching and also the subsequent anisotropic dry etching. Therefore, since it is not necessary to form the etching mask for each etching, thus permitting the manufacturing process to be simplified.

In the above explanation, although the diameter of the small opening area of the opening 3 in which the via hole 3a is formed was 60 $\mu$m, the diameter of 25–60 $\mu$m can be adopted to obtain the semiconductor device having the same effect. The lower limit is a value which permits the opening for the GaAs substrate to be made and the Au film 4a to be deposited, and can assure the electric characteristic for the via hole.

Embodiment 7

An explanation will be given of the sixth embodiment of the present invention.

Figure 16:
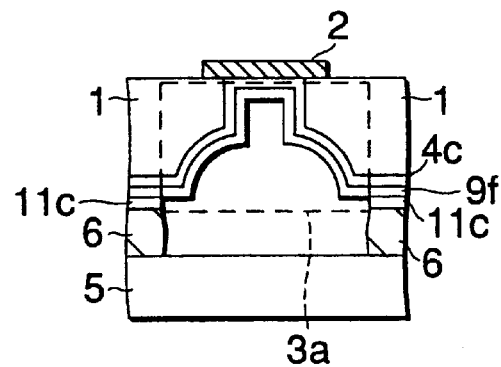
FIG. 16 is a view showing a semiconductor device according to the seventh embodiment.

FIG. 16 is a sectional view of the main part of the semiconductor device according to the seventh embodiment of the present invention. In FIG. 16, reference numeral 9f denotes an Ni film (Ni alloy non-electrolytic plating film) plated on the back surface of the GaAs substrate 1 inclusive of the inner wall and bottom of the opening 3. Reference numeral 11c denotes an Au film stacked on the area on the back surface of the GaAs substrate 1 except the via hole 3a. Other like reference numerals refer to like or corresponding parts described previously.

In the via hole 3a having a structure as shown in FIG. 16, a two-layer structure is formed which includes the Au film 4c and Ni film 9f formed by plating which are stacked on the surface of the opening 3 made in the GaAs substrate 1. On the other hand, at the area except the via hole 3a, a three-layer structure is formed which includes the Au film 11c in addition to the Au film 4c and Ni film 9f which are stacked on the back surface of the GaAs substrate 1.

Referring to the second and sixth embodiments also, an explanation will be given of a method of manufacturing the structure of the semiconductor device as shown in FIG. 16.

First, in accordance with the manufacturing process according to the sixth embodiment, the GaAs substrate 1 is processed as shown in FIGS. 15(*a*) to 15(*e*) so that the opening 3 having a large diameter and a small diameter is formed by a combination of the wet isotropic etching and anisotropic dry etching from the back surface of the GaAs substrate 1. The Au film 4c is deposited onto the back surface of the GaAs substrate 1 inclusive of the inner wall and bottom of the opening 3.

The GaAs substrate 1 is subjected to the processing corresponding to FIGS. 8(*a*) to 8(*d*) in the second embodiment so that the Ni film 9f (which corresponds to the Ni film 9b in FIG. 8) is deposited on the entire back surface of the GaAs substrate 1. Then, the Ni alloy non-electrolytic plating reaction occurs so that the Ni film 9f can be deposited to have a uniform thickness (about 0.5 $\mu$m) also within the opening 3 having a diameter of 60 $\mu$m in the vicinity of the front surface of the GaAs substrate 1.

Thereafter, the Au film 11c (which corresponds to the Au film 11 in FIG. 8) having a thickness of about 0.5 $\mu$m is plated on the back surface of the GaAs substrate 1.

The region except the via hole 3a on the back surface of the GaAs substrate 1 is masked by a masking material such as a resist pattern. Using this masking material as an etching mask, the Au film 11c at the region corresponding to the via hole 3a is selectively etched. Thereafter, the etching mask is removed so that the semiconductor device having the via hole 3a as shown in FIG. 16 can be completed.

In the process as described above, since the Ni film 9f can be selectively exposed on the surface of the region corresponding to the via hole 3a in die bonding, the "solder upheaval" phenomenon due to die bonding can be suppressed. The GaAs substrate 1 can be suppressed from becoming locally thin. For this reason, the via hole 3a having an improved shape can be obtained.

The Ni film 9f constituting the via hole 3a of the semiconductor device according to this embodiment was formed by subjecting the entire back surface of the GaAs substrate 1 to non-electrolytic plating. But, the Ni film 9f can be deposited by general Ni plating techniques. Although the Ni film 9f formed by the general Ni plating techniques is not deposited on the inner wall and bottom of the opening having a small diameter of 60 $\mu$m, it is deposited within the opening having a larger diameter. Thus, when the die bonding is carried out, the via hole with an improved shape with no "solder upheaval" can be obtained. A description will be given of the effects of the invention defined in each of aspects.

The semiconductor device defined in the first aspect, in which a Ni alloy non-electrolytic plating film is selectively deposited through the Au film at a region constituting the via hole including the cylindrical opening made from the back surface of the GaAs substrate to the front surface thereof, can provide a preferred shape when such an IC substrate is subjected to die bonding. It can also reduce the occupying area of the via hole.

The semiconductor device defined in the second aspect, in which a first Au film and Ni alloy non-electrolytic plating film are successively stacked on the entire back surface of said semiconductor substrate (inclusive of the inner wall and bottom of the opening) and a second Au film is deposited at an area except a region constituting the via hole, can provide a preferred shape when such an IC substrate is subjected to die bonding. It can also reduce the occupying area of the via hole.

The semiconductor device defined in the third aspect, in which said second Au film is may be deposited by plating or evaporation at an area except a region constituting the via hole on the Ni film stacked on the entire back surface of the GaAs substrate, can provide the same effect as that of the second aspect.

In the semiconductor device defined in the fourth aspect, in which a via hole is made within the composite stepped opening, after the Au film is deposited on the back surface of the GaAs substrate, the back surface is selectively subjected to general Ni plating so that the Ni plating film can be deposited on the inner wall and bottom of the opening having a large diameter constituting the via hole. Thus, this semiconductor device can provide a preferred shape when such an IC substrate is subjected to die bonding. It can also reduce the occupying area of the via hole as compared with the conventional technique in which the opening is formed by only wet isotropic etching.

In the semiconductor device defined in the fifth aspect, the via hole is formed within the stepped opening, the first Au film and Ni alloy non-electrolytic plating film are stacked on the entire back surface, and the second Au film is formed at the area except the via hole. Therefore, the Ni plating film can be selectively exposed on the surface at the area constituting the via hole. Thus, this semiconductor device can provide a preferred shape when such an IC substrate is subjected to die bonding. It can also reduce the occupying area of the via hole.

A semiconductor device defined in the sixth aspect, in which the opening having a large diameter of the composite opening in which the via hole is formed may be formed by anisotropic dry etching or by wet isotropic etching, can provide the same effect as that of claim 4 or 5.

A semiconductor device defined in the seventh aspect, when the IC substrate defined in the first to fifth aspects is bonded to a package substrate through solder, can provide a preferred shape.

In a semiconductor device defined in the eighth aspect, in which the aspect ratio of the opening in which the via hole is formed in the IC substrate according to the first and second aspect is within a range from 1 to 10/3, the Ni alloy non-electrolytic plating film can be deposited on the entire back surface of the GaAs substrate inclusive of the inner wall and bottom of the opening. Thus, this semiconductor device can provide a preferred shape when such an IC substrate is subjected to die bonding. It can also reduce the occupying area of the via hole.

In a semiconductor device of the ninth aspect, in which the opening having a small diameter in which the via hole is formed in the IC substrate according to the fourth or fifth aspects a diameter from 25 $\mu$m to 60 $\mu$m, the Ni plating film can be deposited on the entire back surface of the GaAs substrate inclusive of the inner wall and bottom of the opening. Thus, this semiconductor device can provide a preferred shape when such an IC substrate is subjected to die bonding. It can also reduce the occupying area of the via hole as compared with the conventional technique in which the opening is formed by only wet isotropic etching.

A method of manufacturing a semiconductor device of the tenth aspect, in depositing the Ni alloy non-electrolytic plating film within the opening having a high aspect ratioin which the via hole is formed in the back surface of the GaAs substrate, plates the entire back surface inclusive of the inner wall and bottom of the opening so that the Ni alloy non-electrolytic plating film can be also formed on the inner wall and bottom of the opening having a high aspect ratio. The IC substrate thus obtained, when it is subjected to die bonding, can be formed into a preferred shape. The occupying area of the via hole can be also reduced.

In a method of manufacturing a semiconductor substrate defined in the eleventh aspect, in which the portion located at the area except the via hole of the Ni alloy non-electrolytic plating film formed on the entire back surface of the GaAs substrate is etched using, as an etchant, sulfuric/nitric acid containing sulfuric acid of 96 wt %, nitric acid of 70 wt % and water=1:1:3, or ion milling. Therefore, preferred etching can be carried out.

A method of manufacturing a semiconductor device of the twelfth aspect, comprises the step of successively stacking the first Au film, Ni alloy non-electrolytic plating film and second Au film on the entire back surface of the GaAs substrate (inclusive of the inner wall and bottom of the opening) and removing the second Au film located at the region constituting the via hole, thereby selectively exposing the Ni alloy non-electrolytic plating film to the surface of the region constituting the via hole. The IC substrate thus formed, when it is subjected to die bonding, can be formed into a preferred shape. The occupying area of the via hole can be reduced.

A method of manufacturing a semiconductor device defined tenth aspect, comprises the step of successively stacking the first Au film, Ni alloy non-electrolytic plating film and second Au film on the entire back surface of the GaAs substrate (inclusive of the inner wall and bottom of the opening) and depositing the second Au film by evaporation so that the second Au film is selectively deposited on the area except the region constituting the via hole and the Ni alloy non-electrolytic plating film is selectively exposed to the region constituting the via hole. The IC substrate thus formed, when it is subjected to die bonding, can be formed into a preferred shape. The occupying area of the via hole can be also reduced.

The method of manufacturing a semiconductor device of the fourteenth aspect, which comprises the step of making an opening having a large diameter from the back surface and making another opening having a small diameter from the bottom the opening having a large diameter to the front surface of the GaAs substrate, thereby forming a composite stepped opening, and the step of, after having deposited an Au film on the entire back surface of the GaAs substrate, depositing a general Ni plating film on the inner wall and bottom of the opening having a large diameter at the area corresponding to the via hole.

In accordance with such a method of manufacturing a semiconductor device, the IC substrate thus formed, when it is subjected to die bonding, can formed in a preferred shape. The occupying area of the via hole can be decreased as compared with the conventional technique in which the opening is formed by only wet isotropic etching.

The method of manufacturing a semiconductor device of the fifteenth aspect comprises the step of making an opening having a large diameter from the back surface and making another opening having a small diameter from the bottom the opening having a large diameter to the front surface of the GaAs substrate, thereby forming a composite stepped opening, and the step of, after having deposited a first Au film and a Ni non electrolytic plating film on the entire back surface of the GaAs substrate, selectively depositing a second Au film at a region not corresponding the via hole so that the Ni film is plated on at least within the opening having a large diameter.

In accordance with such a method of manufacturing a semiconductor device, the IC substrate thus formed, when it is subjected to die bonding, can formed in a preferred shape. The occupying area of the via hole can be decreased as compared with the conventional technique in which the opening is formed by only wet isotropic etching.

In the method of manufacturing a semiconductor device defined in the sixteenth aspectaccording to the fourth or fifth aspect, the first opening may be made by wet isotropic etching or anisotropic dry etching. In either case, the IC substrate thus formed, when it is subjected to die bonding, can formed in a preferred shape. The occupying area of the via.hole can be decreased as compared with the conventional technique in which the opening is formed by only wet isotropic etching.

In the method of manufacturing a semiconductor device of the seventeenth aspect according to the sixteenth aspect, where the first opening is made by the wet isotropic etching, the second opening can be made by etching using same etching mask so that the manufacturing process can be simplified.

The method of manufacturing a semiconductor device of the eighteenth aspect according to any one of the tenth, twelfth to fifteenth aspects, comprises a step of bonding the IC substrate thus formed to a package substrate by solder. Such die bonding can provide a preferred shape of the IC substrate.

Using an etchant for an Ni alloy of the nineteenth aspect permits the Ni alloy non-electrolytic plating film to be etched preferably.

What is claimed is:

1. A semiconductor device comprising:

a semiconductor substrate having opposed front and back surfaces;

an electrode pad on the front surface of said semiconductor substrate;

a cylindrical opening extending from the back surface of said semiconductor substrate to said electrode pad on the front surface, wherein the opening has an aspect ratio within a range from 1 to 10/3;

an Au film covering all of the back surface of said semiconductor substrate, including an inner wall surface and a bottom of the cylindrical opening; and a Ni alloy film selectively disposed on said Au film, covering part of the back surface of said semiconductor substrate, only adjacent the opening, and covering the inner wall surface and the bottom of the cylindrical opening, wherein the Ni alloy film includes at least one element selected from the group consisting of P, B, and W.

2. A semiconductor device comprising:

a semiconductor substrate having opposed front and back surfaces;

an electrode pad on the front surface of said semiconductor substrate;

a stepped cylindrical opening extending from the back surface of said semiconductor substrate to said electrode pad on the front surface, the stepped opening including a first opening having a first diameter at the back surface of said semiconductor substrate and a second opening which is a cylinder having a second diameter, extending from the first opening to the front surface of the semiconductor substrate, wherein the first diameter is larger than the second diameter;

an Au film covering the back surface of said semiconductor substrate and an inner wall and bottom of the cylindrical opening as a via hole; and an Ni alloy film disposed on said Au film only adjacent the opening and covering the inner wall of the via hole at the first opening but not at the second opening.

3. The semiconductor device as claimed in claim 2, wherein said Ni alloy film includes at least one element selected from the group consisting of P, B, and W.

4. The semiconductor device as claimed in claim 2, wherein the second opening has an aspect ratio within a range from 1 to 10/3.

5. The semiconductor device as claimed in claim 2, wherein the second opening has a diameter of 25 $\mu$m to 60 $\mu$m.

* * * * *